United States Patent
Kinzer et al.

(10) Patent No.: US 6,593,622 B2
(45) Date of Patent: Jul. 15, 2003

(54) POWER MOSFET WITH INTEGRATED DRIVERS IN A COMMON PACKAGE

(75) Inventors: Daniel M. Kinzer, El Segundo, CA (US); Tim Sammon, Helensburgh (GB); Mark Pavier, Guildford (GB); Adam I. Amali, Hawthorne, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/138,130

(22) Filed: May 2, 2002

(65) Prior Publication Data

US 2002/0163040 A1 Nov. 7, 2002

Related U.S. Application Data

(60) Provisional application No. 60/288,193, filed on May 2, 2001.

(51) Int. Cl.$^7$ ................................ H01L 29/76
(52) U.S. Cl. ................ 257/341; 257/723; 257/724; 257/773
(58) Field of Search .................... 257/341, 666, 257/723–676, 782, 672, 724–691, 685, 497, 773–901, 109, 904

(56) References Cited

U.S. PATENT DOCUMENTS

| | | | | |
|---|---|---|---|---|
| 5,084,753 A | * | 1/1992 | Goida et al. | 257/685 |
| 5,313,095 A | * | 5/1994 | Tagawa et al. | 257/672 |
| 5,792,676 A | * | 8/1998 | Masumoto et al. | 438/111 |
| 5,814,884 A | * | 9/1998 | Davis et al. | 257/723 |
| 6,066,890 A | * | 5/2000 | Tsui et al. | 257/723 |
| 6,133,632 A | * | 10/2000 | Davis et al. | 257/723 |
| 6,388,319 B1 | * | 5/2002 | Cheah et al. | 257/723 |
| 6,448,643 B2 | * | 9/2002 | Cheah et al. | 257/723 |

\* cited by examiner

*Primary Examiner*—Hoai Ho
*Assistant Examiner*—Andy Huynh
(74) *Attorney, Agent, or Firm*—Ostrolenk, Faber, Gerb & Soffen, LLP

(57) ABSTRACT

A driver stage consisting of an N channel FET and a P channel FET are mounted in the same package as the main power FET. The power FET is mounted on a lead frame and the driver FETs are mounted variously on a separate pad of the lead frame or on the main FET or on the lead frame terminals. All electrodes are interconnected within the package by mounting on common conductive surfaces or by wire bonding. The drivers are connected to define either an inverting or non-inverting drive.

17 Claims, 6 Drawing Sheets

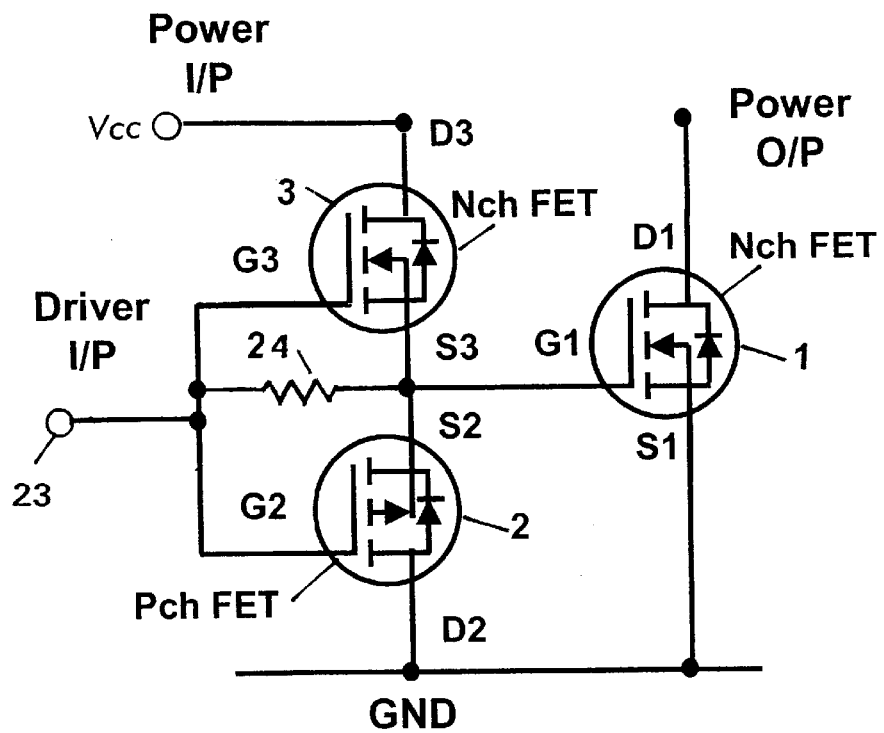
*FIG. 1* (NON INVERTING DRIVE)
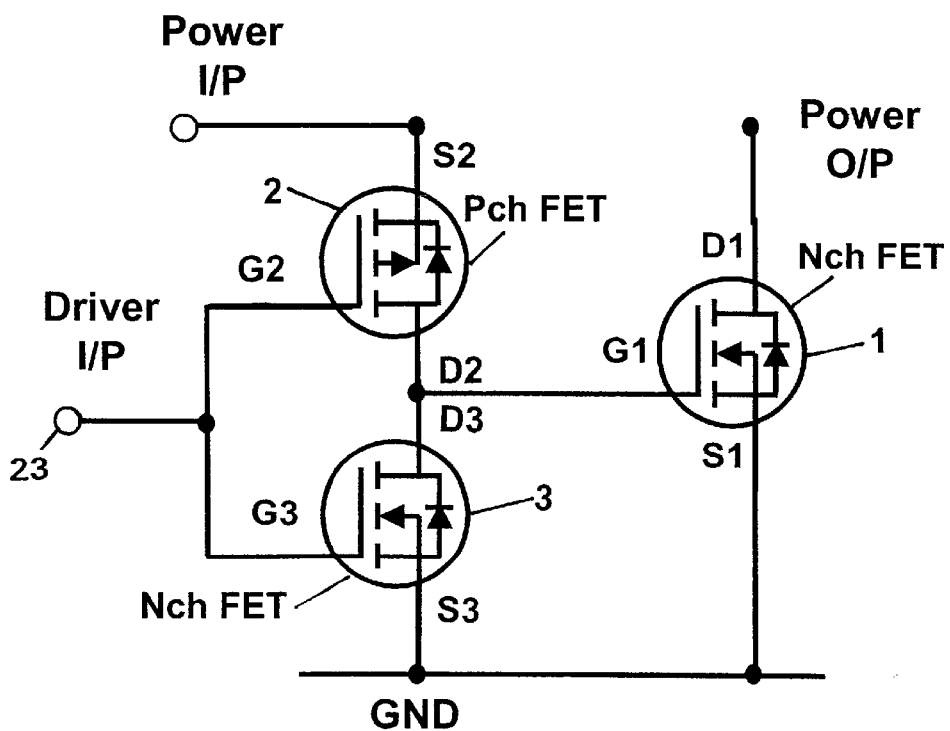
*FIG. 7* (INVERTING DRIVE)

FIG. 3
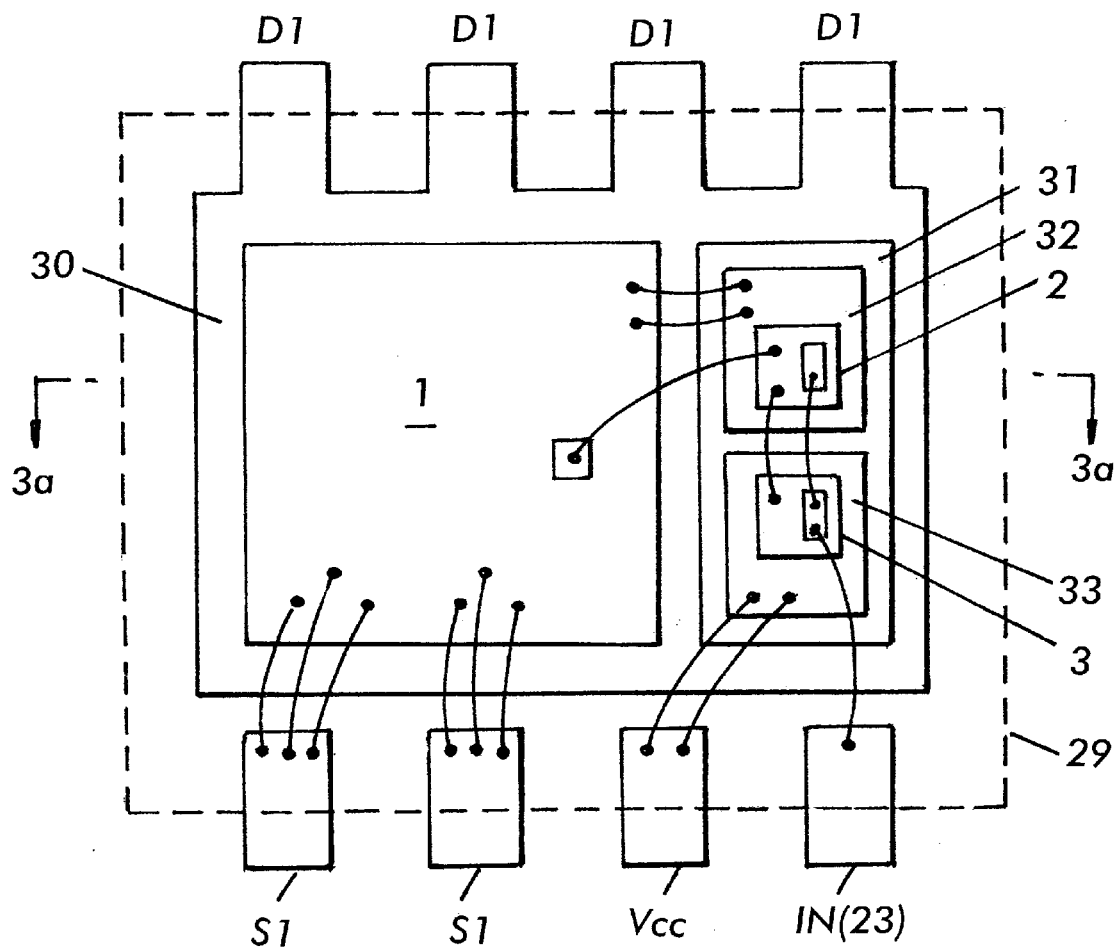
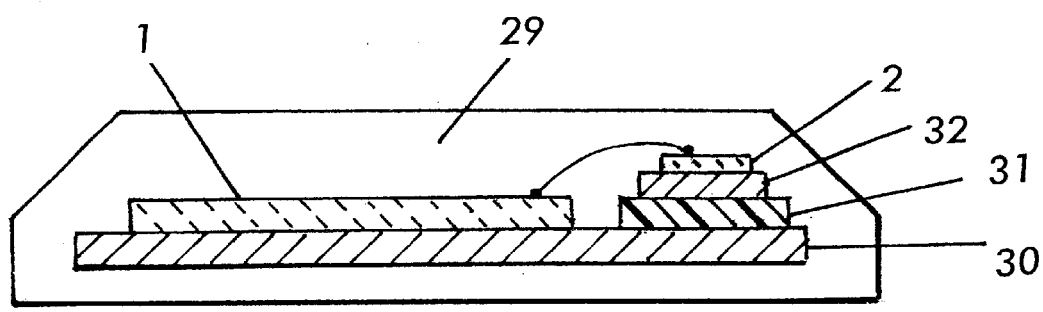
FIG. 3a

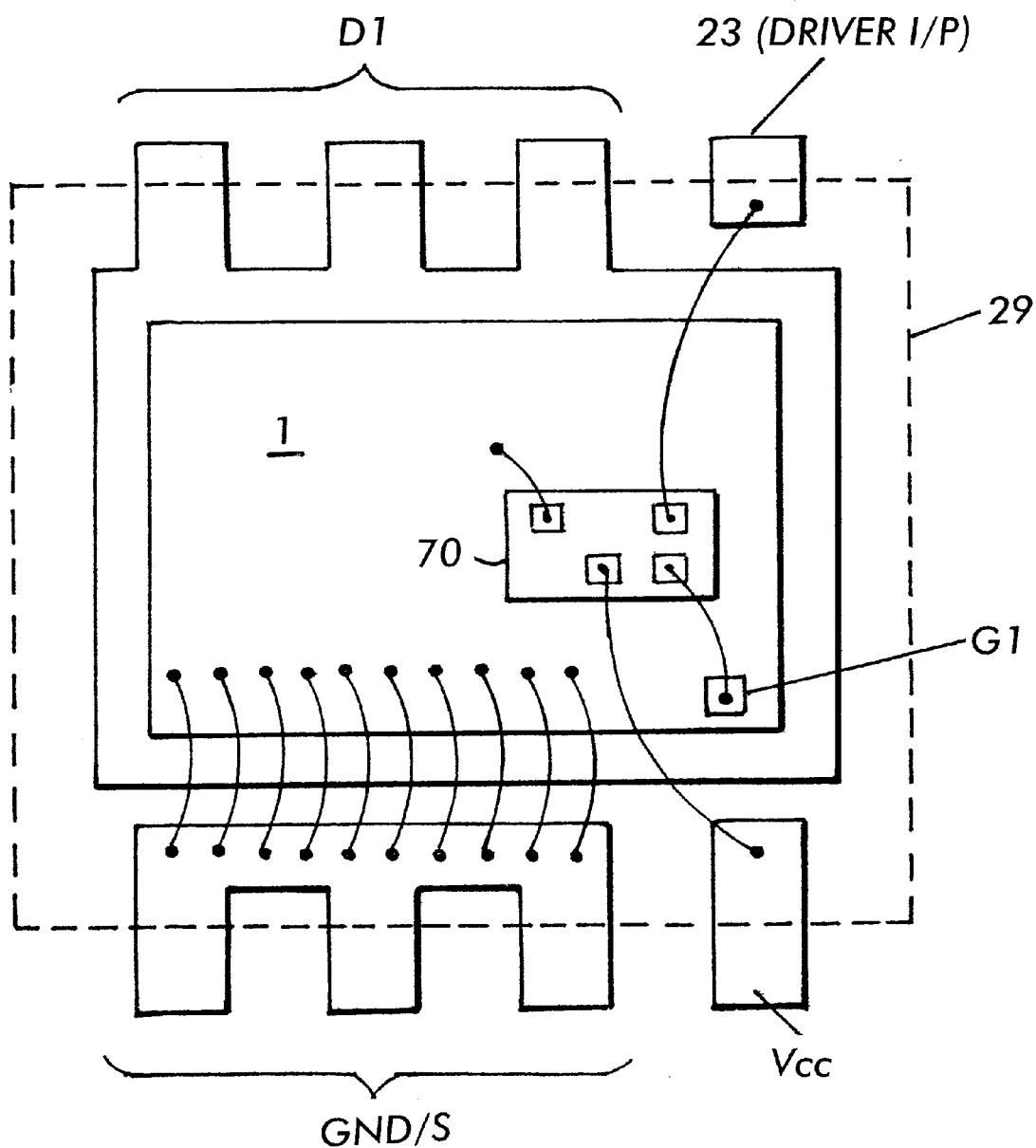

POWER MOSFET WITH INTEGRATED DRIVERS IN A COMMON PACKAGE

RELATED APPLICATION

This application claims the benefit of U.S. Provisional Application No. 60/288,193, filed May 2, 2001.

FIELD OF THE INVENTION

This invention relates to semiconductor devices and more specifically relates to a power MOSFET device with driver FETs integrated into or copacked with the same package to provide drive current to the gate circuit of the power MOSFET.

BACKGROUND OF THE INVENTION

Power MOSFETs frequently require a high gate current pulse for their operation. For example, circuits containing control or synchronous power MOSFETs frequently require a high gate pulse current for their operation. As a specific example, high frequency dc to dc converters such as synchronous buck converters are operated in the region of 3 MHz and above, at breakdown voltages of about 30 volts and below. The gate driver current $i_g$ for the control and synchronous MOSFETs of those circuits is determined, approximately by:

$$i_g = Q_g/t_{ON}$$

For a typical SO-8 packaged device such as the IRF7811W made by the International Rectifier Corporation, the gate charge $Q_g$ required to turn on the MOSFET is in the region of 14nC. If the MOSFET turn on time $t_{ON}$ is limited to 10 ns, the switching current can therefore be of the order 1.4A. This poses a problem for control ICs where capability to deliver this current level is not economically viable, given manufacturing complexity versus chip area required.

Solving this problem has typically been addressed by the addition of separate driver ICs placed in circuit between the control IC and the MOSFETs. As switching frequencies increase, the layout related circuit efficiency of this approach reduces, and the parasitic inductances caused by the distance between the separate components cause higher losses during switching.

BRIEF DESCRIPTION OF THE INVENTION

A driver stage is placed inside the MOSFET package, and the driver current requirement can therefore be reduced to that of two small driver FETs. The total active area of these devices is approximately ¼ that of the main FET/switch. The input drive current will therefore be reduced by similar proportions thereby enabling the driver devices to be driven directly by the control IC, removing the need for discrete driver ICs. In one embodiment of the invention, the internal driver stage uses two separate MOSFET chips in a totem pole configuration. This minimizes the wafer level manufacturing complexity for providing the desired function. The small driver chips can also be integrated with one another, or into the main chip.

The three devices, the main MOSFET and the two smaller driver MOSFETs, when discrete chips, may be copacked in standard small footprint plastic encapsulated packages, such as the well known TSSOP, SOIC, or MLP packages.

BRIEF DESCRIPTION OF THE DRAWINGS

FIG. 1 is a circuit diagram of a non-inverting configuration for an integrated driver and power MOSFET.

FIG. 3 is a top view of a second package embodiment, using an internal isolating substrate on a common lead frame pad.

FIG. 3A is a cross-section of FIG. 3 taken across section line 3a—3a in FIG. 3.

FIG. 7 is a circuit diagram of an inverting driver circuit configuration for the device of the invention.

FIG. 9 is a top view of a further embodiment of lead frame and die to implement the circuit of FIG. 7 with the two driver FETS integrated into a single die, as in FIG. 6.

DETAILED DESCRIPTION OF THE INVENTION

FIG. 1 shows a circuit in which two small MOSFETs, P channel MOSFET 2 and N channel MOSFET 3 act as drivers for a main N channel MOSFET 1. All MOSFETs are vertical conduction devices, although other structures could be used. Further, the MOSFETs 1, 2 and 3 could be replaced by other types of transistors, as desired.

A single input line 23 from a suitable driver integrated circuit (Driver I/P) is connected to gates G2 and G3 of MOSFETs 2 and 3 respectively. The sources S2 and S3 of FETS 2 and 3 respectively are connected to a common node and to G1 of MOSFET 1. Input power terminal I/P and output power terminal O/P are connected as shown with respect to ground GND. An optional resistor 24 may be connected as shown.

In a typical embodiment, the N channel power switch or MOSFET 1 may be a die having an area of 70×102 mils with an $R_{DSON}$ less than about 14 mohm. The P channel gate driver FET 2 may also have a dimension of about 31×29 mils and an $R_{DSON}$ of less than about 140 mohm. The N-channel driver MOSFET may have a dimension of 29×31 mils or less and an $R_{DSON}$ of 140 mohm Resistor 24 may be about 50 ohm and acts to ensure that the gate of MOSFET 1 is pulled down to ground when the driver I/P reaches ground. Without this, an offset voltage equivilent roughly to that of the P-channel driver FET threshold voltage may appear at G1. This could trigger a false switching of MOSFET 1. Alternatively, the threshold voltage of FETs 1 and 2 may be selected so that $V_{gsth}$ is greater than that of $V_{gsth}$ 2. Other die sizes and ratings can be used as desired for a particular application.

Figure 2:
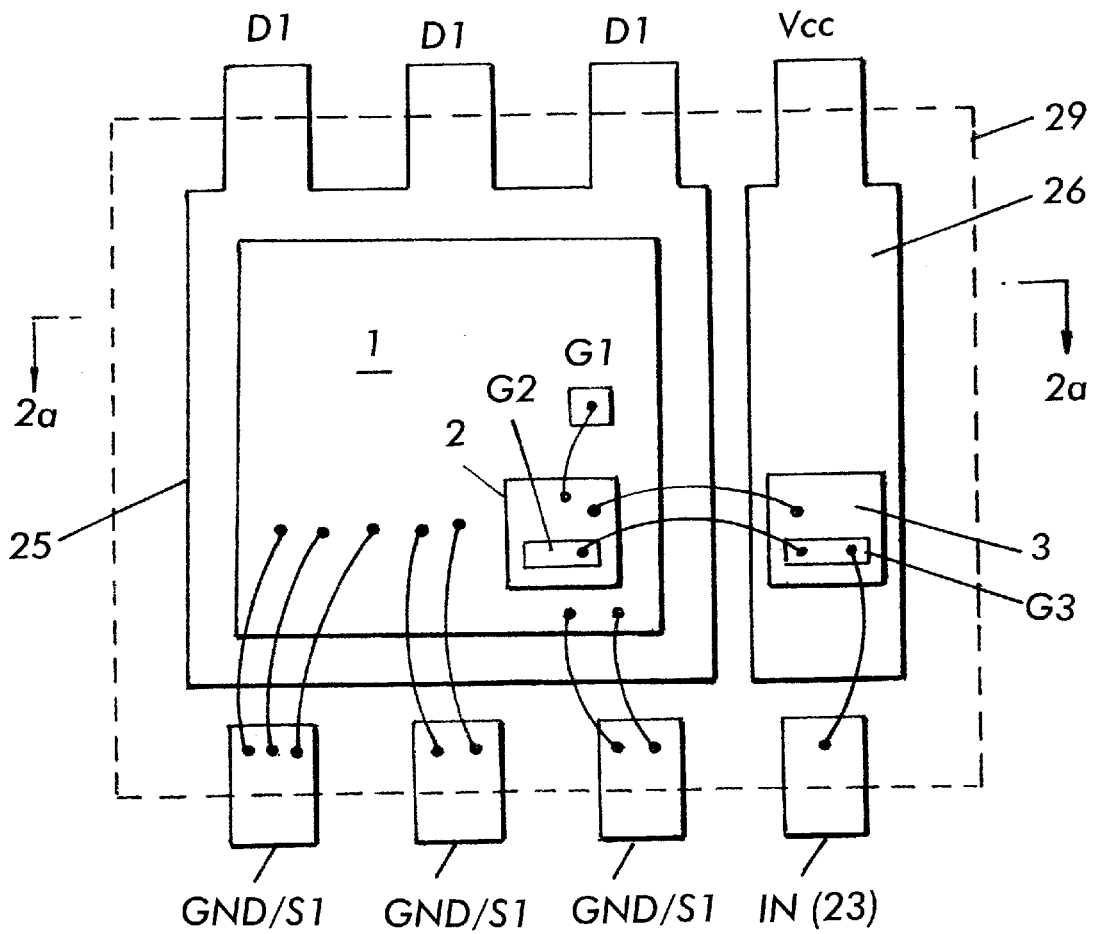
FIG. 2 is a top view of a first embodiment of a dual pad lead frame and the three die forming the circuit of FIG. 1.
Figure 2A:
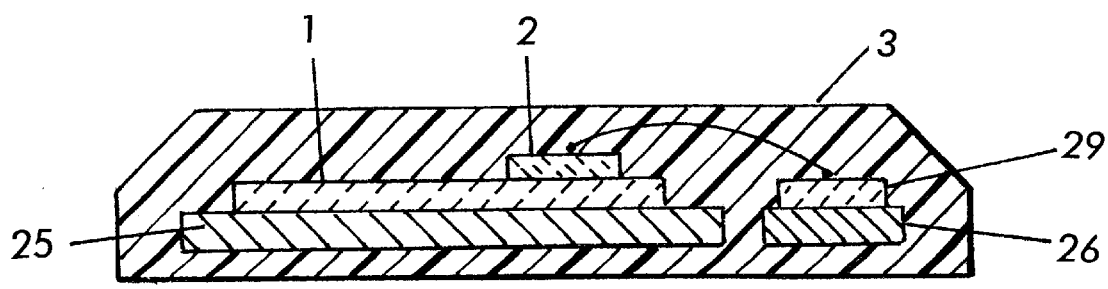
FIG. 2A is a cross-section of FIG. 2, taken across section line 2a—2a in FIG. 2.

FIGS. 2 and 2A show a first manner in which the die of FIG. 1 can be mounted on a lead frame and interconnected and packaged in an insulation housing. The same numerals are used throughout to identify common components. The lead frame in FIGS. 2 and 2A a split frame structure, forming an SOIC; or MLP; or TSSOP package. More specifically, the two N channel switches (sometimes called digital switches or FETS or MOSFETs) 1 and 3 are mounted on the spilt pads 25 and 26 respectively of a conventional downset conductive lead frame, using silver loaded epoxy or an equivalent low resistance adhesive (e.g., solder/film/epoxy or the like). Conductive adhesive is then dispensed upon the N channel switch 1 prior to mounting the P channel MOSFET 2 on the source of MOSFET 1, in a die-on-die configuration. The top metalization of MOSFET 1 may be passivated with appropriate material to protect the gate bus metal against shorting to the source metal by the conductive adhesive applied to bond MOSFET die 2. Note that in order to use this package arrangement, the die may be suitably thinned prior to assembly.

Thereafter, wirebonds are formed between bond pads on die 1, 2 and 3 and the pins GND/S1 and IN (23) in order to form the connections of the circuit of FIG. 1. The bond wires may be gold although, in larger die packages, aluminum could also be used. Copperstrap or ribbon bonding technologies could also be used. The gate pads of digital switches 2 and 3 may be enlarged to allow use of two wire bonds.

Following the wirebond process the subassembly is encapsulated in an insulating housing (e.g. mold compound). Subsequent processes follow the conventional process route for SOIC, TSSOP or MLP packages, depending on which packaging technology is adopted. In the case of SOIC packaging, the coplanar terminals D1, S1, $V_{cc}$ and IN extend out of the encapsulant as shown in FIG. 2.

FIGS. 3 and 3a show the arrangement for the circuit of FIG. 1 on a single lead frame pad 30. An internal isolating substrate or film 31 electrically isolates the bottom drains D2 and D3 of FETS 2 and 3 from the lead frame. Conductive traces 32 and 33 are die bond pads for FETs 2 and 3. Following the die bond process stage pads 32 and 33 are wirebonded to enable the circuit of FIG. 1. The substrate 31 may also carry surface mounted passive components if desired.

Figure 4:
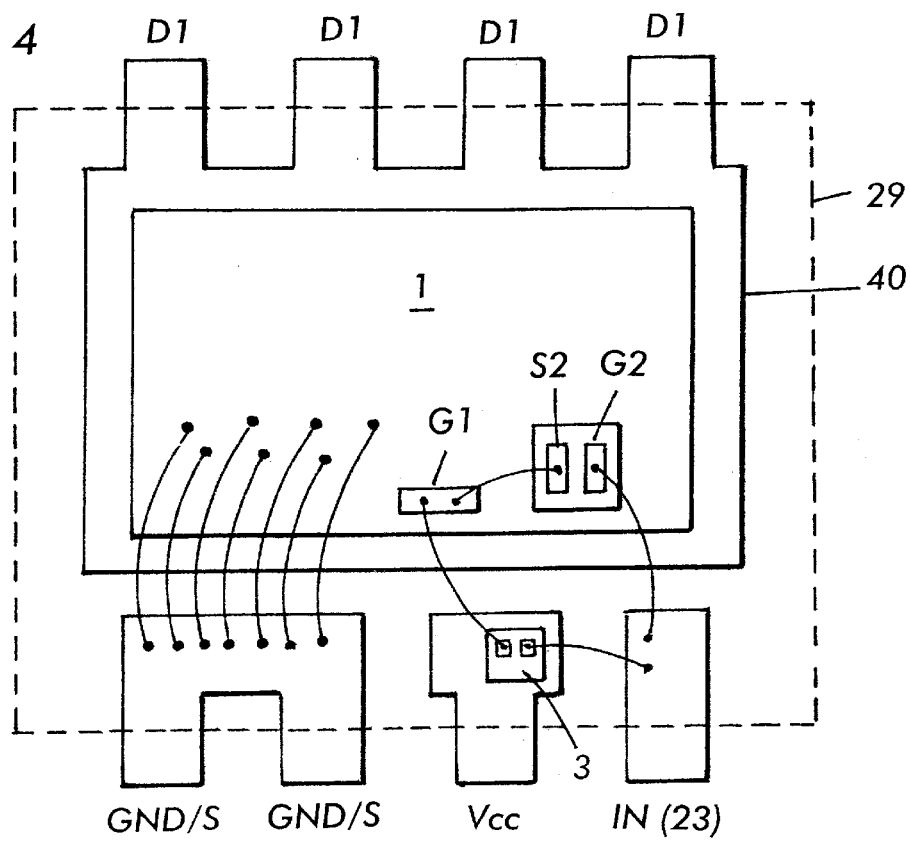
FIG. 4 is a top view of a third embodiment for the three die and a lead frame.

FIG. 4 shows a third arrangement of the parts, using a single downset lead frame 40, with the N channel switch 3 mounted on the Vcc terminal lead. In the embodiment of FIG. 4, the main MOSFET 1 may be a die of dimension 80×157 mils. The driver die 2 and 3 may both be 20×20 mils. The P channel die or switch 2 is mounted atop the source of the main MOSFET1 as by a conductive adhesive. FETS 2 and 3 in FIG. 4 are conventional vertical conduction FETS, but, if desired, could be bipolar transistors rated at 8 volts or greater with a 1.8 volt drive.

Figure 5:
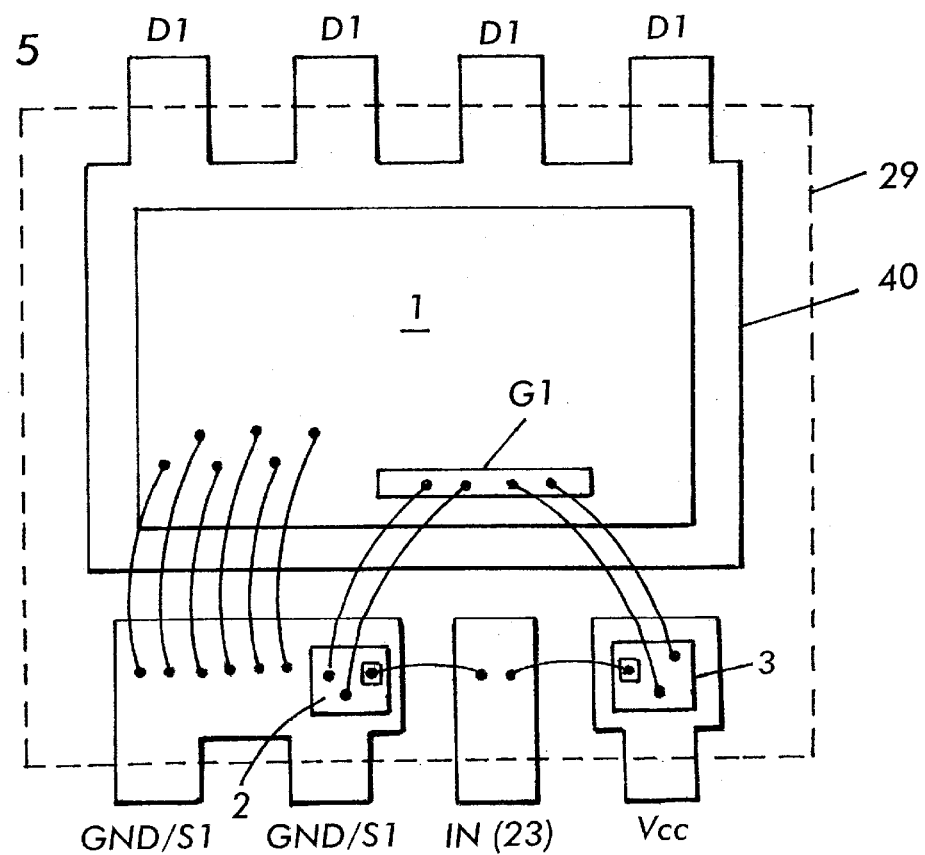
FIG. 5 is a top view of a fourth embodiment for the package.

FIG. 5 is a further package arrangement like that of FIG. 4, in which FETS 2 and 3 are both on respective terminals GND/S and $V_{cc}$ of the lead frame. Note that the G1 pad of MOSFET 1 is enlarged in FIG. 5.

Figure 6:
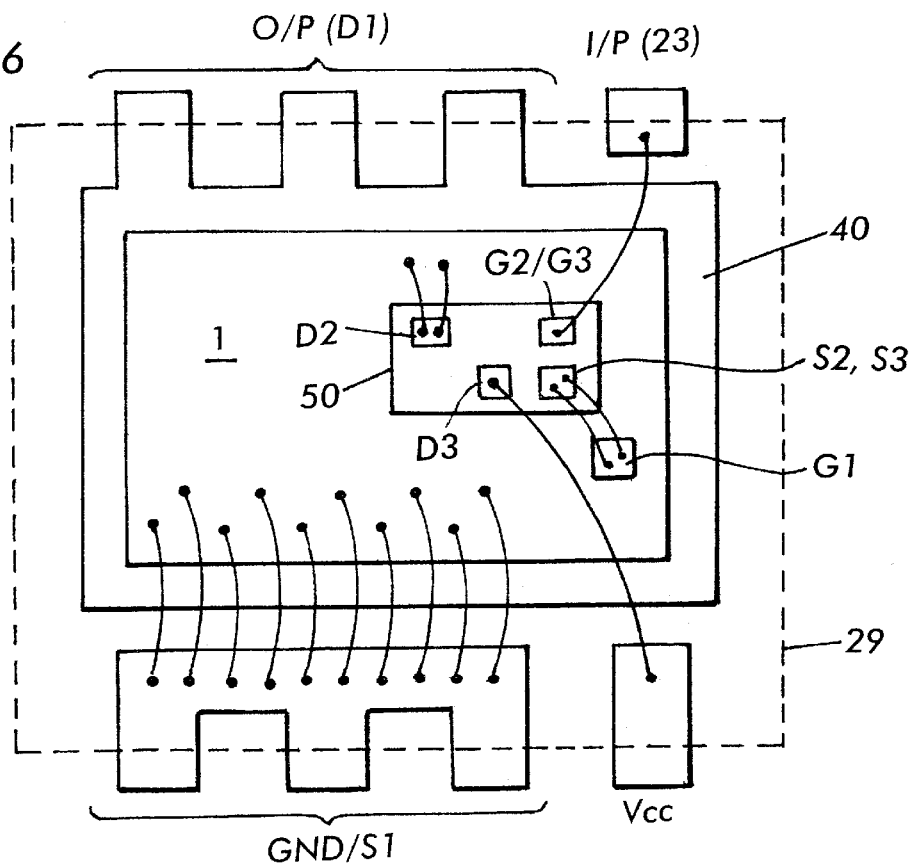
FIG. 6 is a top view of a fifth embodiment in which the two driver FETS are integrated into a common integrated circuit.

FIG. 6 is a still further embodiment for the circuit of FIG. 1 in which both FETS 2 and 3 are integrated into a common chip 50. In the device of FIG. 6, the chip 50 has a common source pad for both S2 and S3 of FIG. 1, and a common gate for both G2 and G3 of FIG. 1. It also has spaced drain pads D2 and D3 on the die upper surface. The benefit of the use of an IC 50 containing both driver switches 2 and 3 is that the die-on-die bonding of the single IC 50 enables the use of a much larger area main switch 1. Further, the structure has reduced capacitance and avoids the need for a split lead frame.

The previous FIGS. 1 to 6 show a circuit and various package layouts for a non-inverting MOSFET plus an integrated driver device. A similar device, whose circuit topology is shown in FIG. 7 (with a common driver for FETS 2 and 3), can be used to provide a solution which reduces the high current gate driver requirements of power MOSFET's in high frequency dc to dc converters. The configuration of FIG. 7, however, inverts the I/P drive signal. Additional invertors may be required on the output of the driver IC prior to the MOSFET 1 with integrated driver stage.

Thus, the circuit of FIG. 7 inverts the topology of the circuit of FIG. 1, with P channel FET 2 on the high side of the circuit and the N channel FET 3 on the low side. The target application for the circuit of FIG. 7 is a 3 MHz converter and eliminates the need for a high current drive from the control IC (which drives terminal 23). The gate G1 is connected to D2, D3 and is redistributed from the main pad to the top of die 2 and 3 for bonding. In a typical application, N channel FET 1 may have a size of about 102×157 mils and about 3.5 mohm. P channel FET 2 may have a size of 31.5×15.75 mils and an on resistance of 250 mohm. N channel FET 3 may have a size of 23.6×15.75 mils and an on resistance of 250 mohms.

Figure 8:
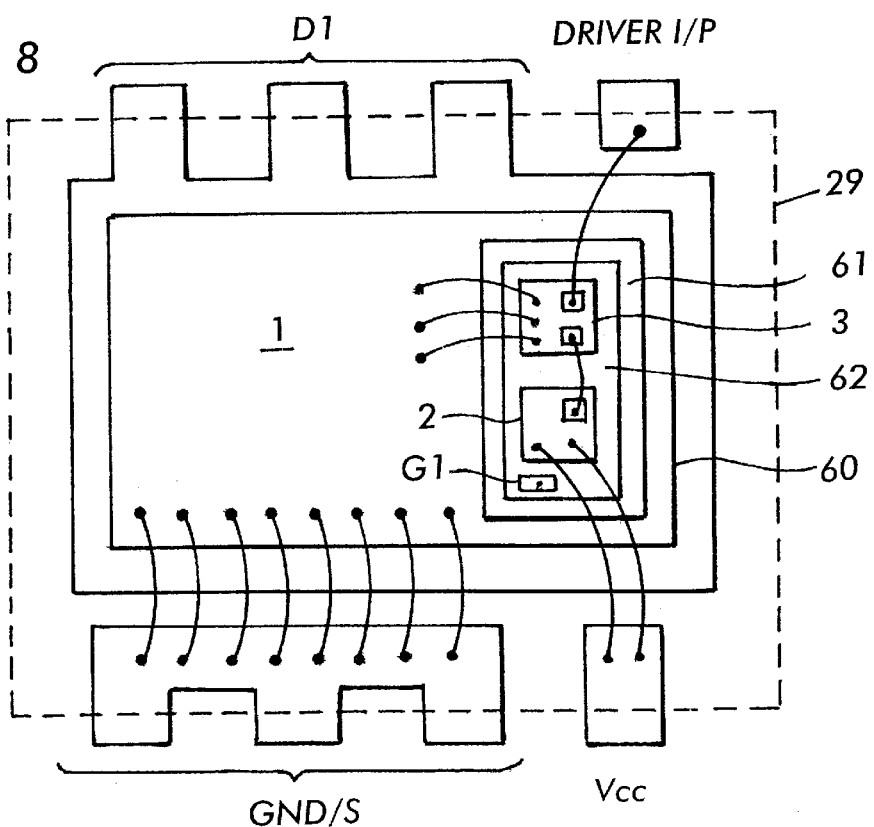
FIG. 8 is a top view of a lead frame and die for implementing the circuit of FIG. 7 with the driver FET insulated from the lead pad by a passivation layer as in FIG. 3.

Device package designs for the circuit of FIG. 7 are shown in FIGS. 8 and 9. Note in these cases the configuration of MOSFETs is a common drain, as opposed to the common source in the non-inverting designs of FIGS. 1 to 6. The three devices 1, 2 and 3 may also be incorporated into MLP, SOIC or TSSOP style plastic encapsulated packages. The integrated substrate and die wirebond pad package solutions previously described are also applicable to the inverting topology.

Referring to FIG. 8, the single lead frame pad 60 receives the main MOSFET 1 and a passivation layer 61 atop S1 of MOSFET 1 receives a conductive layer 62 which is an N/P channel bond pad. The drains of driver FETS 2 and 3 are conductively connected to layer 62 using a conductive adhesive film or paste. The gate of main FET 1 is redistributed atop conductive layer 62 in a suitable manner.

FIG. 9 shows a modification of FIG. 8 in which both MOSFETs 2 and 3 are integrated, like FIG. 6, into a common chip 70. This structure has the same benefits as those of FIG. 6. The digital switch IC 70 may be fixed to the surface of source S1 using an insulation polyimide film. Front side drain connections are required.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A power MOSFET with an integrated P channel driver FET and an N channel driver FET in a common package; said common package comprising a conductive support having extending terminals; said power MOSFET having a drain electrode fixed to said conductive support; said P channel and N channel driver FETs having respective gate, source and drain electrodes, one of said source or drain electrodes of said driver FETs connected at a node to define a series totem pole arrangement with the others of said source or drain electrodes of said driver FETS at the outer ends of said totem pole; the outer terminals of said totem pole circuit connected between a $V_{cc}$ terminal and a ground terminal; and a driver input control terminal connected to said gate electrodes of said P and N channel driver FETs; said power MOSFET having a source electrode connected to said ground terminal; said node between said N and P channel drivers connected to the gate electrode of said power MOSFET; and a single, common insulation housing enclosing said power MOSFET, said conductive support and said N and P channel FETs; said extending terminals including a drain terminal which is connected to said power MOSFET drain electrode, said ground terminal, said $V_{cc}$ terminal and said driver input control terminal.

2. The device of claim 1, wherein said conductive support comprises a lead frame.

3. The device of claim 1, wherein the total area of said N and P channel driver FETs is about ¼ that of said power MOSFET.

4. The device of claim 2, wherein the total area of said N and P channel driver FETs is about ¼ that of said power MOSFET.

5. The device of claim 1, wherein one of said P and N channel driver FETs is mounted on the source electrode of said power FET.

6. The device of claim 2, wherein one of said P and N channel driver FETs is mounted on the source electrode of said power FET.

7. The device of claim 2, wherein one of said P and N channel driver FETs is mounted on one of said terminals.

8. The device of claim 1, wherein said N and P channel driver FETs are integrated into a common chip.

9. The device of claim 2, wherein said N and P channel driver FETs are integrated into a common chip.

10. The device of claim 2, wherein said lead frame has first and second insulated pads; said power MOSFET supported on said first pad; at least one of said P and N channel driver FETs mounted on said second pad.

11. The device of claim 10, wherein the total area of said N and P channel driver FETs is about ¼ that of said power MOSFET.

12. The device of claim 1, wherein said source electrodes of said P and N channel driver FETs are connected at said node.

13. The device of claim 2, wherein said source of said P and N channel driver FETs are connected at said node.

14. The device of claim 3, wherein said source terminals of said P and N channel driver FETs are connected at said node.

15. The device of claim 1, wherein said drain terminals of said P and N channel driver FETs are connected at said node.

16. The device of claim 2, wherein said drain terminals of said P and N channel driver FETs are connected at said node.

17. The device of claim 3, wherein said drain terminals of said P and N channel driver FETs are connected at said node.

* * * * *